US012615696B2

(12) United States Patent
Ogura et al.

(10) Patent No.: US 12,615,696 B2
(45) Date of Patent: Apr. 28, 2026

(54) STORAGE DEVICE AND STORAGE METHOD

(71) Applicant: Tokyo Electron Limited, Tokyo (JP)

(72) Inventors: Koji Ogura, Kumamoto (JP); Hiroshi Yoshida, Kumamoto (JP); Takashi Nagai, Kumamoto (JP); Jun Nonaka, Kumamoto (JP); Keita Hirase, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 753 days.

(21) Appl. No.: 17/321,514

(22) Filed: May 17, 2021

(65) Prior Publication Data

US 2021/0368586 A1     Nov. 25, 2021

(30) Foreign Application Priority Data

May 25, 2020     (JP) ................................. 2020-090898

(51) Int. Cl.
*H05B 1/02*          (2006.01)
*H01L 21/67*          (2006.01)

(52) U.S. Cl.
CPC ..... *H05B 1/0244* (2013.01); *H01L 21/67086* (2013.01); *H05B 1/0233* (2013.01)

(58) Field of Classification Search
CPC ......... H01L 21/67017; H01L 21/67023; H01L 21/67075; H01L 21/67086; H01L 21/67253; H01L 21/67259; H01L 21/67389; C23C 16/0227; C23C 16/4407; C23C 16/4481; C23C 16/45561; C23C 16/45593; H01J 37/3244; H05B 1/0233; H05B 1/0244
See application file for complete search history.

(56) References Cited

U.S. PATENT DOCUMENTS 4,859,375 A * 8/1989 Lipisko ................... C30B 25/14
141/83
5,158,100 A * 10/1992 Tanaka ................... B08B 7/0092
134/108

(Continued)

FOREIGN PATENT DOCUMENTS

JP          2007053282 A          3/2007
JP          2017-118092 A          6/2017

OTHER PUBLICATIONS 10.1016/B978-0-12-386537-3.00005-8, Elsevier Inc., edited by Michael F. L'Annunziata (Year: 2003).*

*Primary Examiner* — Gordon Baldwin
*Assistant Examiner* — Joshua Reyes
(74) *Attorney, Agent, or Firm* — XSENSUS LLP

(57) ABSTRACT

A storage device according to an aspect of the present disclosure includes a storage tank, a heating mechanism, and a controller. The storage tank stores a processing liquid that contains an aqueous solution of phosphoric acid and an additive. The heating mechanism heats the processing liquid that is stored in the storage tank. The controller controls the heating mechanism to execute a concentration maintaining process where a temperature of the processing liquid is adjusted in such a manner that an amount of evaporation of water for the processing liquid in the storage tank approaches an amount of absorption of moisture for the processing liquid in the storage tank.

9 Claims, 3 Drawing Sheets

(56)  References Cited

U.S. PATENT DOCUMENTS

| | | | |
|---|---|---|---|
| 2002/0066535 A1* | 6/2002 | Brown | H01L 21/67017 |
| | | | 118/712 |
| 2004/0194806 A1* | 10/2004 | Yang | H01L 21/67034 |
| | | | 134/34 |
| 2012/0074102 A1* | 3/2012 | Magara | H01L 21/6708 |
| | | | 156/345.23 |
| 2014/0230908 A1* | 8/2014 | Tokoshima | H01L 21/67017 |
| | | | 138/177 |
| 2015/0221530 A1* | 8/2015 | Hara | H01L 21/67017 |
| | | | 134/57 R |
| 2017/0287744 A1* | 10/2017 | Kobayashi | H01L 21/30604 |
| 2018/0012777 A1* | 1/2018 | Sato | H01L 21/67253 |
| 2019/0067048 A1* | 2/2019 | Takaki | H01L 21/67173 |
| 2019/0096711 A1* | 3/2019 | Ohno | H01L 21/67017 |
| 2019/0148183 A1* | 5/2019 | Inada | H01L 21/67017 |
| | | | 438/745 |

* cited by examiner

STORAGE DEVICE AND STORAGE METHOD

CROSS-REFERENCE TO RELATED APPLICATION

The present application claims the benefit of priority to Japanese Patent Application No. 2020-090898 filed on May 25, 2020, the entire contents of which Japanese Patent Application are incorporated by reference in the present application.

FIELD

A disclosed embodiment(s) relate(s) to a storage device and a storage method.

BACKGROUND

It has conventionally been known that, in a substrate processing system, a substrate is dipped in an etching liquid that includes an aqueous solution of phosphoric acid and a silicon solution so as to process such a substrate (see Japanese Patent Application Publication No. 2017-118092).

SUMMARY

A storage device according to an aspect of the present disclosure includes a storage tank, a heating mechanism, and a controller. The storage tank stores a processing liquid that contains an aqueous solution of phosphoric acid and an additive. The heating mechanism heats the processing liquid that is stored in the storage tank. The controller controls the heating mechanism to execute a concentration maintaining process where a temperature of the processing liquid is adjusted in such a manner that an amount of evaporation of water for the processing liquid in the storage tank approaches an amount of absorption of moisture for the processing liquid in the storage tank.

DESCRIPTION OF EMBODIMENTS

Figure 1:
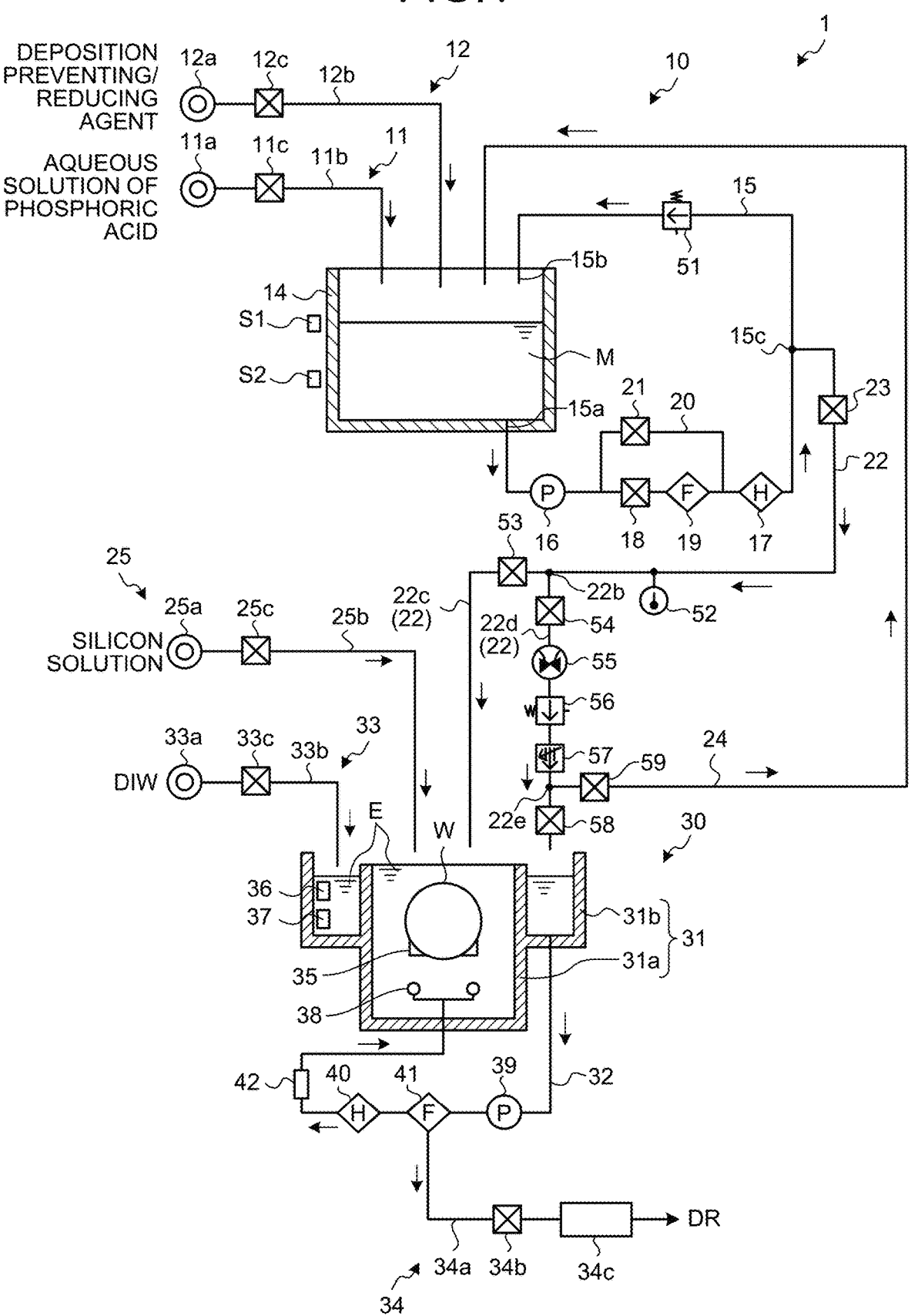
FIG. 1 is a schematic block diagram that illustrates a configuration of a substrate processing system according to an embodiment.

Hereinafter, a mode(s) for implementing (that will be described as an embodiment(s) below) a storage device and a storage method according to the present disclosure will be explained in detail, with reference to the drawing(s). Additionally, the present disclosure is not limited by such an embodiment(s). Furthermore, it is possible to combine respective embodiments appropriately as long as process contents thereof are not inconsistent. Furthermore, in respective embodiments as provided below, identical sites thereof will be provided with identical signs so as to omit a redundant explanation thereof.

Furthermore, although an expression of "constant", "orthogonal", "perpendicular", or "parallel" may be used in an embodiment as illustrated below, such an expression does not have to be strictly "constant", "orthogonal", "perpendicular", or "parallel". That is, each expression as described above tolerate, for example, a deviation of manufacturing accuracy, placement accuracy, or the like.

Furthermore, an orthogonal coordinate system where a direction of an X-axis, a direction of a Y-axis, and a direction of an Z-axis that are orthogonal to one another are defined and a positive direction of the Z-axis is provided as a vertically upward direction may be illustrated in each drawing as being referred to below, for the sake of clarity of explanation. Furthermore, a direction of rotation where a vertical axis is provided as a center of rotation may be called a θ-direction.

An embodiment provides a technique that is capable of implementing substrate processing properly by a processing liquid that includes an aqueous solution of phosphoric acid and a silicon solution.

It has conventionally been known that, in a substrate processing system, a substrate is dipped in an etching liquid that includes an aqueous solution of phosphoric acid and a silicon solution so as to execute an etching process for such a substrate.

For example, a substrate is dipped in an aqueous solution of phosphoric acid ($H_3PO_4$), so that it is possible to etch, among a silicon nitride (SiN) film and a silicon oxide ($SiO_2$) film that are laminated on a substrate, the silicon nitride film selectively.

Moreover, a silicon solution (an aqueous solution of a silicon-containing compound) is added to an aqueous solution of phosphoric acid, so that it is possible to improve a selection ratio for etching of a silicon nitride film to a silicon oxide film.

On the other hand, as a silicon nitride film is etched, silicon that is included in such a silicon nitride film is dissolved out in an etching liquid, so that a concentration of silicon in an aqueous solution of phosphoric acid may be excessive. As a concentration of silicon in an aqueous solution of phosphoric acid is excessive, silicon oxide ($SiO_2$) is deposited on a silicon oxide film, so that an etching process for a substrate may be inhibited by such deposited silicon oxide.

Hence, a technique is expected that is capable of implementing an etching process properly by an etching liquid that includes an aqueous solution of phosphoric acid and a silicon solution.

For example, a storage device that stores a processing liquid that contains an aqueous solution of phosphoric acid and an additive that prevents or reduces deposition of silicon oxide is connected to a processing tank where an etching process as described above is executed. A storage device stores a processing liquid as described above and supplies a processing liquid as described above that does not include silicon to a processing tank for purpose of decreasing a concentration of silicon at a predetermined timing, for example, a timing when a concentration of silicon in an etching liquid is excessive.

Herein, a variation of a concentration of a processing liquid as described above that is caused by absorption of moisture thereby is readily caused. Specifically, a processing liquid as described above absorbs water in an atmosphere (or absorbs moisture), so that a concentration of phosphoric acid is readily decreased. As a concentration of phosphoric acid in a storage device is decreased, a decrease of a concentration of phosphoric acid is also caused in a processing tank where a processing liquid is supplied from such a storage device, and as a result, an etching process may not properly be implemented.

Hence, a technique that is capable of executing management of a concentration of a processing liquid in a storage device properly is expected.

Configuration of Substrate Processing System

First, a configuration of a substrate processing system 1 according to an embodiment will be explained with reference to FIG. 1. FIG. 1 is a schematic block diagram that illustrates the substrate processing system 1 according to an embodiment. The substrate processing system 1 is an example of a substrate processing apparatus.

The substrate processing system 1 includes a mixing device 10 (an example of a storage device), a silicon solution supply unit 25, and a substrate processing unit 30.

The mixing device 10 mixes an aqueous solution of phosphoric acid and a deposition preventing/reducing agent (an example of an additive) that prevents or reduces deposition of a silicon oxide, so as to produce a mixed liquid M (an example of a processing liquid). Furthermore, the mixing device 10 supplies a produced mixed liquid M to a processing tank 31 of the substrate processing unit 30.

The silicon solution supply unit 25 supplies a silicon-containing compound aqueous solution (that will be described as a "silicon solution" below) to the processing tank 31 of the substrate processing unit 30.

The substrate processing unit 30 stores an etching liquid E that contains a mixed liquid M and a silicon solution in the processing tank 31. Furthermore, the substrate processing unit 30 dips a wafer W (an example of a substrate) in an etching liquid E that is stored in the processing tank 31 so as to etching-process the wafer W. In an embodiment, for example, it is possible to etch, among a silicon nitride (SiN) film and a silicon oxide ($SiO_2$) film that are formed on a wafer W, the silicon nitride film selectively.

(For Mixing Device)

The mixing device 10 includes a phosphoric acid aqueous solution supply unit 11, a deposition preventing/reducing agent supply unit 12 (an example of an additive supply unit), a tank 14 (an example of a storage tank), and a circulation route 15.

The phosphoric acid aqueous solution supply unit 11 supplies an aqueous solution of phosphoric acid to the tank 14. The phosphoric acid aqueous solution supply unit 11 has a phosphoric acid aqueous solution supply source 11a, a phosphoric acid aqueous solution supply route 11b, and a flow volume regulator 11c.

The phosphoric acid aqueous solution supply source 11a is, for example, a tank that stores an aqueous solution of phosphoric acid. The phosphoric acid aqueous solution supply route 11b connects the phosphoric acid aqueous solution supply source 11a and the tank 14 and supplies an aqueous solution of phosphoric acid from the phosphoric acid aqueous solution supply source 11a to the tank 14. The flow volume regulator 11c is provided on the phosphoric acid aqueous solution supply route 11b and regulates a flow volume of an aqueous solution of phosphoric acid that is supplied to the tank 14. The flow volume regulator 11c is composed of an on-off valve, a flow volume control valve, a flow volume meter, and the like.

The deposition preventing/reducing agent supply unit 12 supplies a deposition preventing/reducing agent to the tank 14. Such a deposition preventing/reducing agent supply unit 12 has a deposition preventing/reducing agent supply source 12a, a deposition preventing/reducing agent supply route 12b, and a flow volume regulator 12c.

The deposition preventing/reducing agent supply source 12a is, for example, a tank that stores a deposition preventing/reducing agent. The deposition preventing/reducing agent supply route 12b connects the deposition preventing/reducing agent supply source 12a and the tank 14 and supplies a deposition preventing/reducing agent from the deposition preventing/reducing agent supply source 12a to the tank 14. The flow volume regulator 12c is provided on the deposition preventing/reducing agent supply route 12b and regulates a flow volume of a deposition preventing/reducing agent that is supplied to the tank 14. The flow volume regulator 12c is composed of an on-off valve, a flow volume control valve, a flow volume meter, and the like.

Additionally, it is sufficient that a deposition preventing/reducing agent includes a component that prevents deposition of a silicon oxide. For example, a component may be included that stabilizes a silicon ion that is dissolved in an aqueous solution of phosphoric acid in a dissolved state thereof so as to prevent or reduce deposition of a silicon oxide. Furthermore, a component may be included that prevents or reduces deposition of a silicon oxide in another publicly-known method.

For a deposition preventing/reducing agent according to an embodiment, it is possible to use, for example, an aqueous solution of hexafluorosilicic acid ($H_2SiF_6$) that includes a fluorine component. Furthermore, an additive such as ammonia may be included in order to stabilize hexafluorosilicic acid in an aqueous solution thereof.

For a deposition preventing/reducing agent according to an embodiment, it is possible to use, for example, ammonium hexafluorosilicate (($NH_4$)$_2SiF_6$), sodium hexafluorosilicate ($Na_2SiF_6$), and/or the like.

Furthermore, a deposition preventing/reducing agent according to an embodiment may be a compound that includes an element that is a cation with an ionic radius of 0.2 Å to 0.9 Å. Herein, an "ionic radius" is a radius of an ion that is empirically obtained from a sum of radii of an anion and a cation that are obtained from a lattice constant of a crystal lattice.

A deposition preventing/reducing agent according to an embodiment may include, for example, an oxide of an element of any of aluminum, potassium, lithium, sodium, magnesium, calcium, zirconium, tungsten, titanium, molybdenum, hafnium, nickel, and chromium.

Furthermore, a deposition preventing/reducing agent according to an embodiment may include at least one of a nitride, a chloride, a bromide, a hydroxide, and a nitrate of any of elements as described above, instead of or in addition to an oxide of any of elements as described above.

A deposition preventing/reducing agent according to an embodiment may include, for example, at least one of $Al(OH)_3$, $AlCl_3$, $AlBr_3$, $Al(NO_3)_3$, $Al_2(SO_4)_3$, $AlPO_4$, and $Al_2O_3$.

Furthermore, a deposition preventing/reducing agent according to an embodiment may include at least one of KCl, KBr, KOH, and $KNO_3$. Moreover, a deposition preventing/reducing agent according to an embodiment may include at least one of LiCl, NaCl, $MgCl_2$, $CaCl_2$, and $ZrCl_4$.

The tank 14 stores an aqueous solution of phosphoric acid that is supplied from the phosphoric acid aqueous solution supply unit 11 and a deposition preventing/reducing agent that is supplied from the deposition preventing/reducing agent supply unit 12. Furthermore, the tank 14 stores a mixed liquid M that is produced by mixing an aqueous solution of phosphoric acid and a deposition preventing/reducing agent.

A top part of the tank 14 is opened and a first liquid level sensor S1 and a second liquid level sensor S2 are provided thereon in order from above. A height(s) of a liquid level(s) of an aqueous solution of phosphoric acid and/or a mixed liquid M that is/are stored in the tank 14 is/are controlled by such a first liquid level sensor S1 and a second liquid level sensor S2. Moreover, in an embodiment, such a first liquid level sensor S1 and a second liquid level sensor S2 are used, so that it is possible to weigh a liquid volume(s) of an aqueous solution of phosphoric acid and/or a deposition preventing/reducing agent.

The circulation route 15 is a circulation line that starts from the tank 14 and returns to such a tank 14. The circulation route 15 has an inlet 15a that is provided on a bottom part of the tank 14 and an outlet 15b that is provided on a top part of the tank 14 and forms a circulation flow that flows from such an inlet 15a toward an outlet 15b. Additionally, in an embodiment, the outlet 15b is arranged above a liquid level of a mixed liquid M that is stored in the tank 14.

The circulation route 15 is provided with a pump 16, an on-off valve 18, a filter 19, a heater 17 (an example of a heating mechanism), a branching part 15c, and a back pressure valve 51 in order from an upstream side where the tank 14 is a reference thereof (a most upstream side). Furthermore, a liquid sending route 22 that sends a mixed liquid M to the processing tank 31 of the substrate processing unit 30 branches from the branching part 15c.

The liquid sending route 22 is connected to an inner tank 31a and an outer tank 31b of the processing tank 31 from the branching part 15c. The liquid sending route 22 has a flow volume regulator 23. The flow volume regulator 23 regulates a flow volume of a mixed liquid M that is supplied to the processing tank 31. The flow volume regulator 23 is composed of an on-off valve, a flow volume control valve, a flow volume meter, and the like.

A thermometer 52 is provided on an upstream side of a branching part 22b on the liquid sending route 22. Such a thermometer 52 measures a temperature of a mixed liquid M that flows through the liquid sending route 22. Additionally, the branching part 22b is a site on the liquid sending route 22 where a liquid sending route 22c that is connected to the inner tank 31a and a liquid sending route 22d that is connected to the outer tank 31b branch therefrom. That is, the liquid sending route 22c and the liquid sending route 22d are parts of the liquid sending route 22.

The liquid sending route 22c is provided with a valve 53 and the liquid sensing route 22d is provided with a valve 54, a flow volume meter 55, a constant-pressure valve 56, a throttle valve 57, a branching part 22e, and a valve 58 in order from an upstream side thereof. Furthermore, a return route 24 that returns a mixed liquid M to the tank 14 branches from the branching part 22e. Such a return route 24 has a valve 59.

A controller as described below opens or closes the valve 53 and the valve 54 alternately. Thereby, it is possible for the controller to execute switching thereof and send a mixed liquid M to the inner tank 31a or the outer tank 31b.

The flow volume meter 55 measures a flow volume of a mixed liquid M that flows through the liquid sending route 22d. The controller may correct information of a flow volume of a mixed liquid M that is obtained from the flow volume meter 55, based on information of a temperature of the mixed liquid M that is obtained from the thermometer 52. Thereby, even in a case where a temperature of a mixed liquid M is greatly changed within a range of a room temperature to a higher temperature, it is possible to measure a flow volume of the mixed liquid M that flows through the flow volume meter 55 accurately.

The constant-pressure valve 56 regulates a pressure on a downstream side of the constant-pressure valve 56 on the liquid sending route 22d. The throttle valve 57 regulates a flow volume of a mixed liquid M that flows through the liquid sending route 22d.

The controller opens or closes the valve 58 and the valve 59 alternately. Thereby, it is possible for the controller to execute switching thereof and send a mixed liquid M to the outer tank 31b or the tank 14.

The pump 16 forms a circulation flow of a mixed liquid M that starts from the tank 14, passes through the circulation route 15, and returns to the tank 14.

The heater 17 heats a mixed liquid M that circulates in the circulation route 15. In an embodiment, such a heater 17 heats a mixed liquid M so as to heat the mixed liquid M that is stored in the tank 14.

The filter 19 removes a contaminant such as a particle(s) that is/are included in a mixed liquid M that circulates in the circulation route 15. Additionally, the circulation route 15 is provided with a bypass channel 20 that bypasses such a filter 19, and such a bypass channel 20 is provided with an on-off valve 21.

Then, the on-off valve 18 that is provided on the circulation route 15 and the on-off valve 21 that is provided on the bypass channel 20 are opened or closed alternately, so that it is possible to form any of a circulation flow that flows through the filter 19 and a circulation flow that bypasses the filter 19.

The back pressure valve 51 is provided on a downstream side of the branching part 15c on the circulation route 15. The back pressure valve 51 regulates a pressure on an upstream side (for example, the branching part 15c) of the back pressure valve 51 on the circulation route 15.

(For Silicon Solution Supply Unit)

The silicon solution supply unit 25 supplies a silicon solution to the processing tank 31. A silicon solution according to an embodiment is, for example, a solution where a colloidal silicon is dispersed. The silicon solution supply unit 25 has a silicon solution supply source 25a, a silicon solution supply route 25b, and a flow volume regulator 25c.

The silicon solution supply source 25a is, for example, a tank that stores a silicon solution. The silicon solution supply route 25b is connected to the inner tank 31a of the processing tank 31. The flow volume regulator 25c is provided on the silicon solution supply route 25b and regulates a flow volume of a silicon solution that flows through the silicon solution supply route 25b. The flow volume regulator 25c is composed of an on-off valve, a flow volume control valve, a flow volume meter, and/or the like.

(For Substrate Processing Unit)

The substrate processing unit 30 includes the processing tank 31, a circulation route 32, a DIW supply unit 33, and an etching liquid discharge unit 34. The processing tank 31 has the inner tank 31a and the outer tank 31b.

A top part of the inner tank 31a is opened and an etching liquid E is supplied to a neighborhood of the top part. In such an inner tank 31a, a plurality of wafers W are dipped in an etching liquid E by a substrate lifting/lowering mechanism 35, so that an etching process is executed for the wafers W. Such a substrate lifting/lowering mechanism 35 is configured to be capable of executing lifting and lowering, and arranges a plurality of wafers W back and forth and holds them in a perpendicular attitude thereof.

The outer tank 31*b* is provided on an periphery of a top part of the inner tank 31*a* and the top part is opened. An etching liquid E that overflows the inner tank 31*a* flows into the outer tank 31*b*.

A mixed liquid M is supplied from the mixing device 10 to the inner tank 31*a* and the outer tank 31*b* through the liquid sending route 22. Furthermore, a silicon solution is supplied from the silicon solution supply unit 25 to the inner tank 31*a* through the silicon solution supply route 25*b*. Moreover, DIW (DeIonized Water: deionized water) is supplied from the DIW supply unit 33 to the outer tank 31*b*.

The DIW supply unit 33 has a DIW supply source 33*a*, a DIW supply route 33*b*, and a flow volume regulator 33*c*. The DIW supply unit 33 resupplies water that is evaporated from a heated etching liquid E, so that DIW is supplied to the outer tank 31*b*.

The DIW supply route 33*b* connects the DIW supply source 33*a* and the outer tank 31*b* and supplies DIW at a predetermined temperature from the DIW supply source 33*a* to the outer tank 31*b*.

The flow volume regulator 33*c* is provided on the DIW supply route 33*b* and regulates an amount of supply of DIW that is supplied to the outer tank 31*b*. The flow volume regulator 33*c* is composed of an on-off valve, a flow volume control valve, a flow volume meter, and/or the like. An amount of supply of DIW is regulated by the flow volume regulator 33*c*, so that a temperature of an etching liquid E, a concentration of phosphoric acid therein, a concentration of silicon therein, and a concentration of a deposition preventing/reducing agent are regulated.

Furthermore, the outer tank 31*b* is provided with a temperature sensor 36 and a phosphoric acid concentration sensor 37. The temperature sensor 36 detects a temperature of an etching liquid E and the phosphoric acid concentration sensor 37 detects a concentration of phosphoric acid in the etching liquid E. Signals that are produced by the temperature sensor 36 and the phosphoric acid concentration sensor 37 are transmitted to the controller as described above.

The outer tank 31*b* and the inner tank 31*a* are connected by the circulation route 32. One end of the circulation route 32 is connected to a bottom part of the outer tank 31*b* and another end of the circulation route 32 is connected to a processing liquid supply nozzle 38 that is placed in the inner tank 31*a*.

The circulation route 32 is provided with a pump 39, a filter 41, a heater 40, and a silicon concentration sensor 42 in order from a side of the outer tank 31*b*.

The pump 39 forms a circulation flow of an etching liquid E that is sent from the outer tank 31*b* to the inner tank 31*a* through the circulation route 32. Furthermore, an etching liquid E overflows the inner tank 31*a* so as to flow out to the outer tank 31*b* again. Thus, a circulation flow of an etching liquid E is formed in the substrate processing unit 30. That is, such a circulation flow is formed in the outer tank 31*b*, the circulation route 32, and the inner tank 31*a*.

The heater 40 adjusts a temperature of an etching liquid E that circulates on the circulation route 32. The filter 41 filters an etching liquid E that circulates on the circulation route 32. The silicon concentration sensor 42 detects a concentration of silicon in an etching liquid E that circulates on the circulation route 32. A signal that is produced by the silicon concentration sensor 42 is transmitted to the controller.

The etching liquid discharge unit 34 discharges an etching liquid E that includes a silicon solution to a drain DR at a time when all or a part of the etching liquid E that is used for an etching process is replaced. The etching liquid discharge unit 34 has a discharge route 34*a*, a flow volume regulator 34*b*, and a cooling tank 34*c*.

The discharge route 34*a* is connected to the circulation route 32. The flow volume regulator 34*b* is provided on the discharge route 34*a* and regulates an amount of discharge of a discharged etching liquid E. The flow volume regulator 34*b* is composed of an on-off valve, a flow volume control valve, a flow volume meter, and/or the like.

The cooling tank 34*c* temporarily stores and cools an etching liquid E that flows through the discharge route 34*a*. In the cooling tank 34*c*, an amount of discharge of an etching liquid E is regulated by the flow volume regulator 34*b*.

(For Controller)

Although illustration is omitted herein, the substrate processing system 1 further includes a controller. The controller controls an operation of each unit of the substrate processing system 1 based on a signal(s) from a switch, a variety of sensors, and/or the like.

Such a controller is, for example, a computer, and has a (non-illustrated) computer-readable storage medium. Such a storage medium stores a program that controls a variety of processes that are executed in the substrate processing system 1.

The controller controls an operation of the substrate processing system 1 by reading and executing a program that is stored in a storage medium. Additionally, a program may be stored in a computer-readable storage medium and be installed in a storage medium of the controller from another storage medium.

A computer-readable storage medium is, for example, a hard disk (HD), a flexible disk (FD), a compact disk (CD), a magnetooptical disk (MO), a memory card, or the like.

Figure 2:
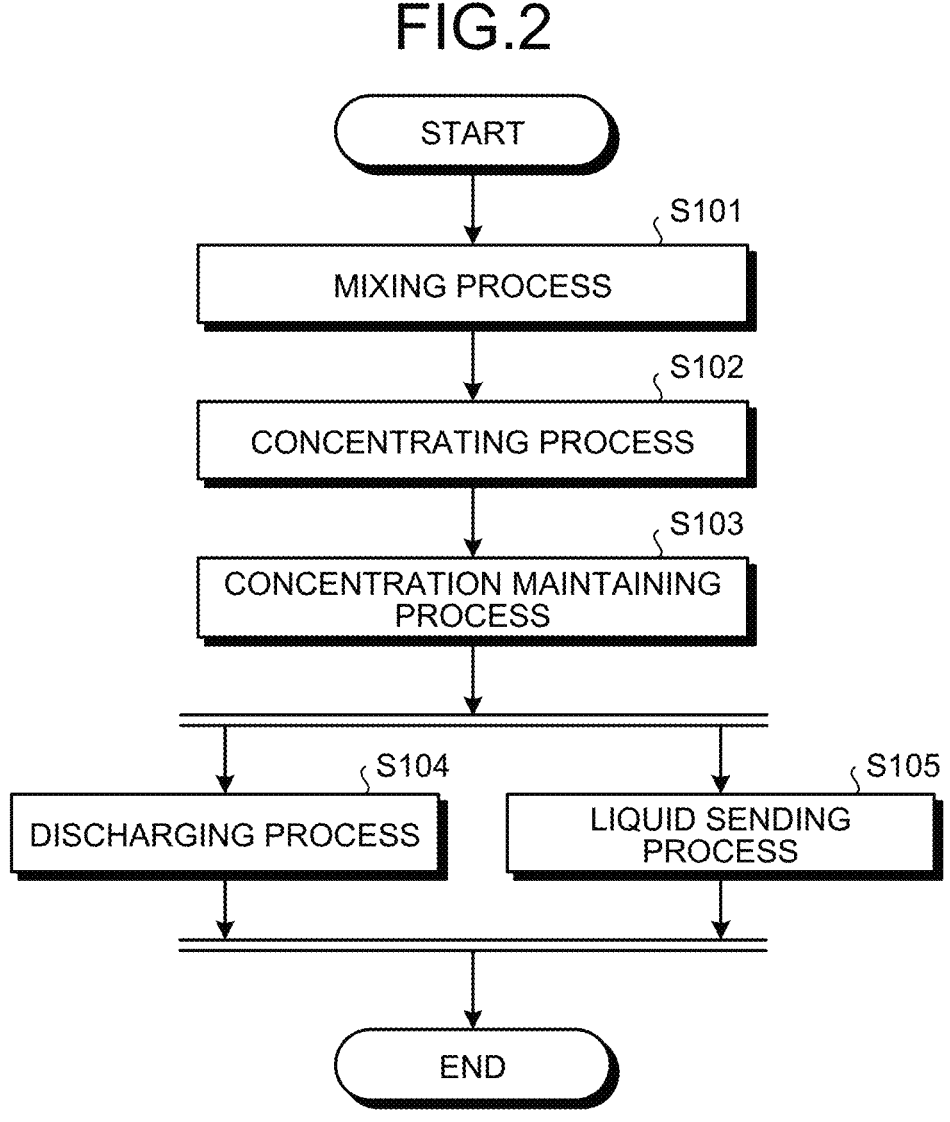
FIG. 2 is a flowchart that illustrates a procedure of a concentration adjusting process according to an embodiment.

Next, an adjustment method for a concentration of silicon in a mixed liquid M in the substrate processing system 1 according to an embodiment will be explained with reference to FIG. 2. FIG. 2 is a flowchart that illustrates a procedure of a concentration adjusting process according to an embodiment.

A concentration adjusting process as illustrated in FIG. 2 is executed at a time when an etching process is executed in the substrate processing unit 30, that is, at a time when a wafer W is dipped in the processing tank 31 of the substrate processing unit 30. Specifically, a concentration adjusting process discharges a part of an etching liquid E where a concentration of silicon is excessive from the processing tank 31 and supplies a mixed liquid M from the mixing device 10 to the processing tank 31, so that a concentration of silicon in the etching liquid E in the processing tank 31 is lowered.

As illustrated in FIG. 2, in the substrate processing system 1, first, a mixing process is executed (step S101). A mixing process is a process where an aqueous solution of phosphoric acid and a deposition preventing/reducing agent are supplied to the tank 14 so as to produce a mixed liquid M.

First, the controller operates the phosphoric acid aqueous solution supply unit 11 (or provides an ON-state thereof) so as to supply an aqueous solution of phosphoric acid from the phosphoric acid aqueous solution supply source 11*a* to the tank 14.

At such a point of time, the deposition preventing/reducing agent supply unit 12, the silicon solution supply unit 25, the pump 16, or the heater 17 is not operated (or is in an OFF state thereof). Furthermore, at such a point of time, the on-off valve 18 is in a closed state thereof and the on-off valve 21 is in an opened state thereof. Hence, the filter 19 is in a state it is bypassed by the bypass channel 20 (where a filter bypass is in an ON-state thereof) and the back pressure valve 51 is in a fully opened state thereof. Furthermore, at such a point of time, the flow volume regulator 23 is in a closed state (an OFF state) thereof where no storage is executed in the tank 14. Hence, OFF signals are output from the first liquid level sensor S1 and the second liquid level sensor S2.

As a predetermined amount of an aqueous solution of phosphoric acid is supplied to the tank 14, the controller operates the pump 16 (or provides an ON state thereof) so as to form a circulation flow on the circulation route 15.

As a liquid level of an aqueous solution of phosphoric acid in the tank 14 rises to a second height or greater, an ON signal is output from the second liquid level sensor S2. Accordingly, the controller operates the deposition preventing/reducing agent supply unit 12 (or provides an ON state thereof) so as to supply a deposition preventing/reducing agent from the deposition preventing/reducing agent supply source 12a to the tank 14. Furthermore, the controller stops the phosphoric acid aqueous solution supply unit 11 (or provides an OFF state thereof).

Then, as a predetermined amount of a deposition preventing/reducing agent is supplied to the tank 14, the controller stops the deposition preventing/reducing agent supply unit 12 (or provides an OFF state thereof) and operates the phosphoric acid aqueous solution supply unit (or provides an ON state thereof) so as to supply an aqueous solution of phosphoric acid to the tank 14.

As a liquid level of a mixed liquid M in the tank 14 rises to a first height or greater, an ON signal is output from the first liquid level sensor S1. Then, the controller determines that a predetermined amount of an aqueous solution of phosphoric acid is supplied to the tank 14, and stops the phosphoric acid aqueous solution supply unit 11 (or provides an OFF state thereof). Thereby, a mixing process is completed.

Thus, the controller operates the pump 16 before a deposition preventing/reducing agent is supplied to the tank 14. Thereby, it is possible to form a circulation flow on the circulation route 15 before a deposition preventing/reducing agent is supplied, so that it is possible to improve a mixing property of an aqueous solution of phosphoric acid and a deposition preventing/reducing agent.

Furthermore, the controller does not simultaneously supply an aqueous solution of phosphoric acid and a deposition preventing/reducing agent to the tank 14 but supplies each thereof to the tank 14 separately. Thereby, it is possible to prevent or reduce outputting of an ON signal from the first liquid level sensor S1 before a predetermined amount of a deposition preventing/reducing agent is supplied. Therefore, it is possible to supply a predetermined amount of a deposition preventing/reducing agent to the tank 14 reliably.

Then, in the substrate processing system 1, a concentrating process is executed (step S102). A concentrating process is a process where a mixed liquid M that is produced at step S101 is concentrated so as to increase a concentration of phosphoric acid in the mixed liquid M.

First, the controller operates the heater 17 (or provides an ON-state thereof) so as to heat a mixed liquid M that circulates in the circulation route 15. A mixed liquid M that circulates in the circulation route 15 is heated, so that a temperature of the mixing liquid M that is stored in the tank 14 is raised.

A mixed liquid M is heated, so that water in the mixed liquid M is evaporated. Thereby, it is possible to increase a concentration of phosphoric acid in a mixed liquid M. A heating temperature of a mixed liquid M in a concentrating process is a temperature that is preliminarily determined as a temperature where an amount of evaporation of water for the mixed liquid M exceeds an amount of absorption of moisture for the mixed liquid M.

Additionally, the mixing device 10 may include a third liquid level sensor at a position that is lower than that of the first liquid level sensor S1 and is higher than that of the second liquid level sensor S2. In such a case, the controller may end a concentrating process in a case where an OFF signal is output from a third liquid level sensor. In such a case, a height of a liquid level of a mixed liquid M in the tank 14 is a third height that is less than a first height and is greater than a second height.

Furthermore, the mixing device 10 may include a phosphoric acid concentration meter that measures a concentration of phosphoric acid in a mixed liquid M. A phosphoric acid concentration meter may be provided on the tank 14 or may be provided on the circulation route 15. In such a case, the controller may end a concentrating process in a case where a concentration of phosphoric acid that is measured by a phosphoric acid concentration meter reaches a predetermined value. Herein, the controller may resupply an aqueous solution of phosphoric acid from the phosphoric acid aqueous solution supply unit 11 to the tank 14 until an ON signal is output from the first liquid level sensor S1 in a case where an OFF signal is output from the first liquid level sensor S1. Thereby, it is possible to maintain a height of a liquid level of a mixed liquid M in the tank 14 at a first height.

Then, in the substrate processing system 1, a concentration maintaining process is executed (step S103). A concentration maintaining process is a process for maintaining a concentration of phosphoric acid in a mixed liquid M in the tank 14 at a concentration thereof at a time of a concentrating process within a waiting time before a liquid sending process as described later is started.

In a concentration maintaining process, the controller controls the heater 17 so as to adjust a temperature of a mixed liquid M in such a manner that an amount of evaporation of water for the mixed liquid M in the tank 14 approaches an amount of absorption of moisture for the mixed liquid M in the tank 14.

In a case where a mixed liquid M is at an ordinary temperature, an amount of absorption of moisture for the mixed liquid M exceeds an amount of evaporation of water for the mixed liquid M. Hence, a rate of water in a mixed liquid M is increased, and accordingly, a concentration of phosphoric acid in the mixed liquid M is decreased. On the other hand, in a concentrating process, an amount of evaporation of water for a mixed liquid M exceeds an amount of absorption of moisture for the mixed liquid M, as described above. Hence, in a concentration maintaining process, the controller heats a mixed liquid M in the tank 14 at a temperature that is higher than an ordinary temperature and is lower than that at a time of a concentrating process. For example, the controller heats a mixed liquid M in the tank 14 at a temperature that is lower than 100° C.

Thus, a temperature of a mixed liquid M is adjusted in such a manner that an amount of evaporation of water for the mixed liquid M approaches an amount of absorption of moisture for the mixed liquid M, so that it is possible to prevent or reduce a change of a concentration of the mixed liquid M in the tank 14. Thereby, in a liquid sending process at a later stage, it is possible to supply a mixed liquid M that is concentrated at a desired concentration in a concentrating process from the tank 14 to the processing tank 31 while a desired concentration as described above is maintained. Therefore, according to the substrate processing system 1, it is possible to implement an etching process suitably by an etching liquid E that includes an aqueous solution of phosphoric acid and a silicon solution.

In a concentration maintaining process, the controller may heat a mixed liquid M at a temperature that is preliminarily acquired by an experiment or the like as a temperature of the mixed liquid M where an amount of evaporation of water and an amount of absorption of moisture for the mixed liquid M are equivalent.

Furthermore, the controller may control the heater 7 so as to heat a mixed liquid M in such a manner that an amount of the mixed liquid M in the tank 14 after a concentrating process is maintained, so that an amount of evaporation of water for the mixed liquid M approaches an amount of absorption of moisture for the mixed liquid M.

For example, in an embodiment, a height of a liquid level of a mixed liquid M in the tank 14 after a concentrating process is a first height that corresponds to the first liquid level sensor S1 or a third height that corresponds to a non-illustrated third liquid level sensor. The controller controls the heater 17 based on a signal (an ON signal and an OFF signal) from the first liquid level sensor S1 or a non-illustrated third liquid level sensor, so that it is possible to maintain a height of a liquid level of a mixed liquid M in the tank 14 after a concentrating process.

In such a case, the mixing device 10 may include a water supply unit that supplies water (for example, DIW) to the tank 14. The controller supplies water from the water supply unit to the tank 14 until an OFF signal is output from the first liquid level sensor S1 or the third liquid level sensor in a case where a liquid level of a mixed liquid M in the tank 14 is lowered so as to output an OFF signal from the first liquid level sensor S1 or the third liquid level sensor. Thereby, it is possible to maintain an amount of a mixed liquid M in the tank 14 after a concentrating process, and eventually, it is possible to maintain a concentration of phosphoric acid in the mixed liquid M in the tank 14 after the concentrating process.

Thus, the heater 17 is controlled so as to heat a mixed liquid M in such a manner that an amount of the mixed liquid M in the tank 14 after a concentrating process is maintained, so that it is possible to facilitate maintenance of a concentration of phosphoric acid in the mixed liquid M.

Then, in the substrate processing system 1, a discharging process (step S104) and a liquid sending process (step S105) are executed, for example, in parallel.

In a discharging process, the controller opens an on-off valve of the flow volume regulator 34b (see FIG. 1) so as to discharge a part of an etching liquid E that is stored in the processing tank 31.

Then, in a liquid sending process, the controller controls the mixing device 10, the liquid sending route 22, and the return route 24 so as to send, for example, a mixed liquid with an amount that is similar to that of an etching liquid E that is discharged from the processing tank 31 in a discharging process to the processing tank 31.

Specifically, the controller provides the flow volume regulator 23 in an opened state thereof (or provides an ON state thereof) and provides the back pressure valve 51 in a narrowed state thereof. Furthermore, the controller changes the valve 53 to a closed state thereof and changes the valve 54 to an opened state thereof.

Thereby, the controller sends a mixed liquid M from the mixing device 10 to the outer tank 31b of the substrate processing unit 30 through the circulation route 15, the liquid sending route 22, and the liquid sending route 22d. A mixed liquid M is not supplied to the inner tank 31a but is supplied to the outer tank 31b, so that it is possible to prevent or reduce rapidly changing of a concentration of silicon in an etching liquid E in the inner tank 31a as compared with a case where the mixed liquid M is directly supplied to the inner tank 31a where a wafer W is processed.

Thereby, it is possible to keep a constant or less concentration of silicon in an etching liquid E in the inner tank 31a constantly. As processes at step S104 and step S105 are ended, a concentration adjusting process is completed.

Herein, although a concentration maintaining process (step S103) is executed over an entire period of time after a concentrating process (step S102) and before a liquid sending process (step S105) is started, the concentration maintaining process may be implemented over at least a part of the period of time as described above.

(Configuration of Mixing Device)

Figure 3:
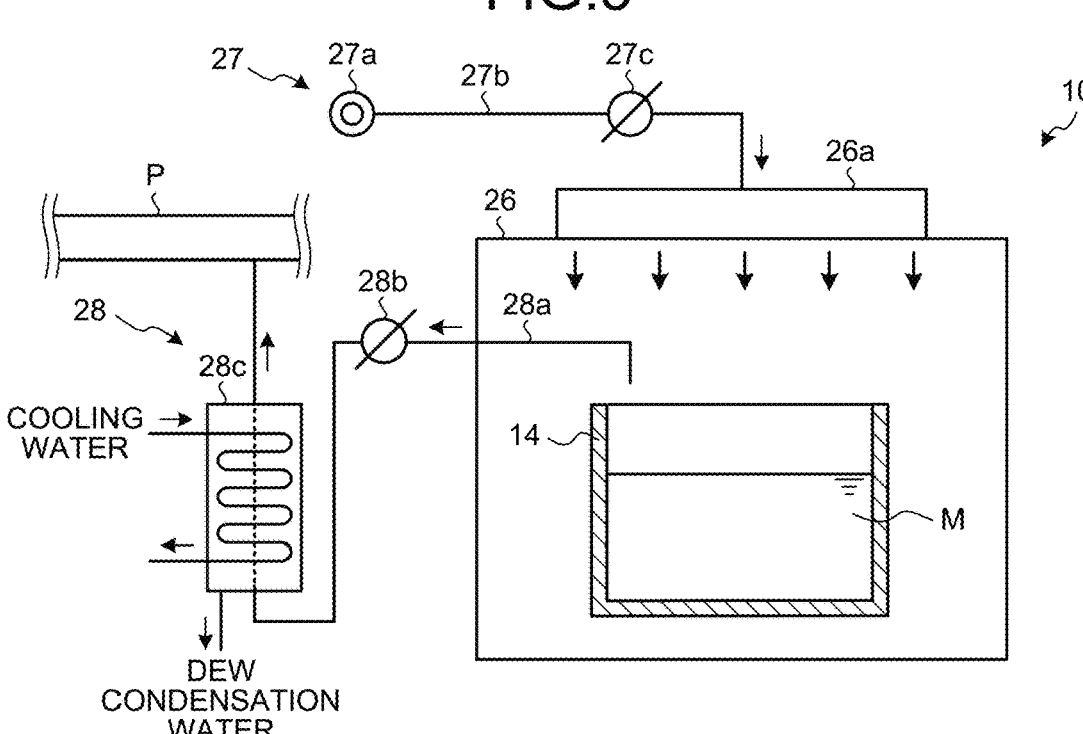
FIG. 3 is a diagram that illustrates a configuration of a mixing device according to an embodiment.

Next, a configuration of the mixing device 10 according to an embodiment will be explained with reference to FIG. 3. FIG. 3 is a diagram that illustrates a configuration of the mixing device 10 according to an embodiment.

As illustrated in FIG. 3, the mixing device 10 further includes a housing unit 26, a gas supply unit 27, and a gas discharge unit 28. The housing unit 26 houses at least the tank 14 among a variety of components that are included in the mixing device 10. A ceiling part of the housing unit 26 is provided with an FFU (Fan Filter Unit) 26a.

The gas supply unit 27 supplies a gas to an inside of the housing unit 26. Specifically, the gas supply unit 27 includes a gas supply source 27a, a gas supply route 27b, and a flow volume regulator 27c. The gas supply source 27a is, for example, a tank that stores a dry gas such as $N_2$ gas and/or dry air. The gas supply route 27b connects the gas supply source 27a and the FFU 26a. A dry gas is supplied from the gas supply source 27a to an inside of the housing unit 26 through the FFU 26a. The flow volume regulator 27c is, for example, a damper, and regulates a flow volume of a dry gas that flows through the gas supply route 27b.

Thus, the mixing device 10 may supply a dry gas to an inside of the housing part 26. Thereby, it is possible to prevent or reduce an amount of absorption of moisture for a mixed liquid M. In other words, it is possible to prevent or reduce a variation of a concentration of a mixed liquid M.

The gas discharge unit 28 discharges a gas from an inside of the housing unit 26. Specifically, the gas discharge unit 28 includes a gas discharge route 28a, a flow volume regulator 28b, and a discharged gas cooling unit 28c. The gas discharge route 28a connects an inside of the housing unit 26 and a gas discharge pipe P that is included in a factory where the mixing device 10 is placed. The flow volume regulator 28b is, for example, a damper, and regulates a flow volume of a gas that flows through the gas discharge route 28a.

The discharged gas cooling unit 28c is provided on the gas discharge route 28a and cools a gas that flows through the gas discharge route 28a. For example, the discharged gas cooling unit 28c is a water-cooled type where cooling water flows through a tube that is arranged like a coil around the gas discharge route 28a, so that it is possible to cool a gas that flows through the gas discharge route 28a.

A mixed liquid M in the tank 14 is heated in a concentrating process and/or a concentration maintaining process, so that a temperature of a gas that is discharged from the housing unit 26 may also be high. As a gas at a high temperature is directly discharged to a gas discharge pipe P of a factory, dew condensation may be caused in the gas discharge pipe P. On the other hand, in the mixing device 10, a gas that is discharged from the housing unit 26 is cooled by using the discharged gas cooling unit 28c, so that it is possible to prevent or reduce causing of dew condensation in a gas discharge pipe P of a factory. Additionally, dew condensation water that is produced in the discharged gas cooling unit 28*c* is discharged from a liquid discharge route that is provided in the discharged gas cooling unit 28*c* to a non-illustrated liquid discharge pipe or the like of a factory.

Figure 4:
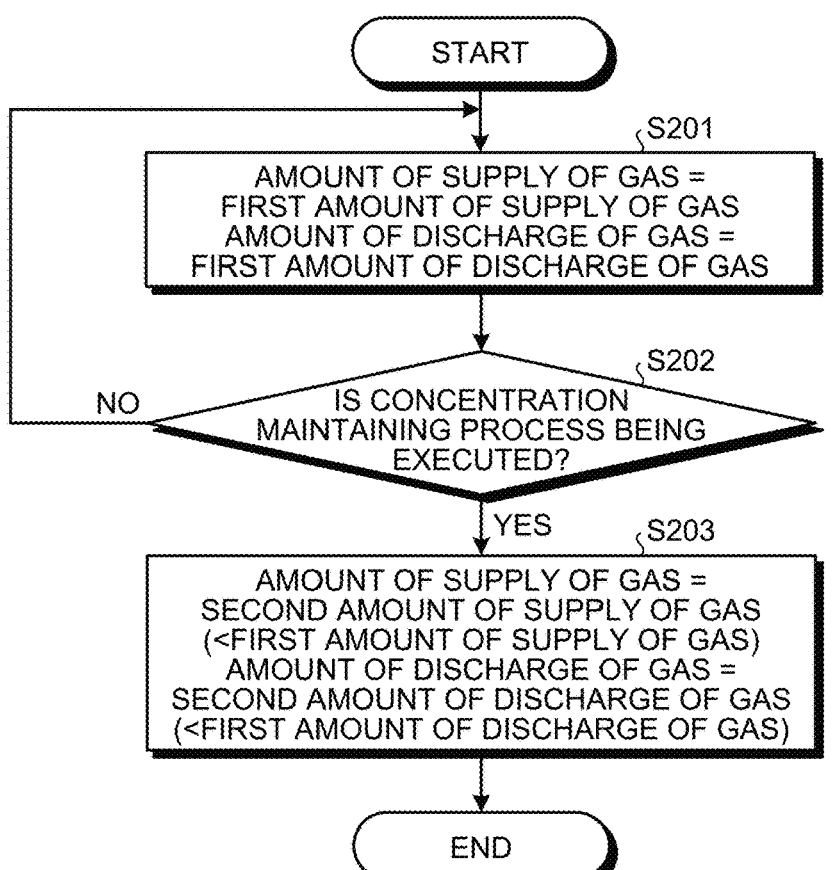
FIG. 4 is a flowchart that illustrates a procedure of a gas supply/discharge amount adjusting process in a mixing device according to an embodiment.

Next, an adjusting process for an amount of supply/discharge of a gas in the mixing device 10 will be explained with reference to FIG. 4. FIG. 4 is a flowchart that illustrates a procedure of a gas supply/discharge amount adjusting process in the mixing device 10 according to an embodiment. A gas supply/discharge amount adjusting process as illustrated in FIG. 4 is started, for example, simultaneously with a mixing process (step S101) as illustrated in FIG. 2 or before the mixing process.

As illustrated in FIG. 4, the controller controls the gas supply unit 27 in such a manner that an amount of supply of a gas to the housing unit 26 is a first amount of supply of a gas and controls the gas discharge unit 28 in such a manner that an amount of discharge of a gas from the housing unit 26 is a first amount of discharge of a gas (step S201), during execution of a mixing process and a concentrating process.

Then, the controller determines whether or not a concentration maintaining process is being executed (step S202). In a case where a concentration maintaining process is not being executed (step S202, No), the controller returns a process to step S201 and maintains a first amount of supply of a gas and a first amount of discharge of a gas.

On the other hand, in a case where it is determined that a concentration maintaining process is being executed (step S202, Yes), the controller controls the gas supply unit 27 so as to provide a second amount of supply of a gas and controls the gas discharge unit 28 so as to provide a second amount of discharge of a gas (step S203), and ends a gas supply/discharge amount adjusting process. A second amount of supply of a gas is less than a first amount of supply of a gas and a second amount of discharge of a gas is less than a first amount of discharge of a gas.

Thus, the controller may decrease an amount of supply/discharge of a gas during execution of a concentration maintaining process, in other words, an amount of ventilation of a gas, relative to an amount of ventilation of a gas during execution of a concentrating process or the like. Thereby, it is possible to decrease contact between a mixed liquid M and a gas in the tank 14, so that it is possible to further prevent or reduce absorption of moisture for the mixed liquid M.

Variation

Although an example of a case where an aqueous solution of phosphoric acid and a deposition preventing/reducing agent are separately supplied to the tank 4 is illustrated as a configuration example of the mixing device 10 in an embodiment as described above, the mixing device 10 may supply a mixed liquid M that preliminarily contains an aqueous solution of phosphoric acid and a deposition preventing/reducing agent to the tank 14.

Although a deposition preventing/reducing agent that prevents or reduces deposition of silicon oxide is provided as an example of an additive in an embodiment as described above, the additive does not have to be a deposition preventing/reducing agent and may be, for example, a silicon compound additive or the like.

In an embodiment as describe above, an example of a case where the substrate processing system 1 includes one mixing device 10 and one substrate processing unit 30, that is, an example of a case where a mixed liquid M is supplied from the one mixing device 10 to the one substrate processing unit 30, is explained. This is not limiting, and a mixed liquid M may be supplied from one mixing device 10 to a plurality of substrate processing units 30. That is, the substrate processing system 1 may be configured to include one or more mixing devices 10 and substrate processing units 30 that are more than the mixing device(s) 10.

The controller may, for example, estimate a timing of a start of a next liquid sending process based on a concentration of silicon that is measured by the silicon concentration sensor 42 and determine a timing of a start of a concentration adjusting process so as to end a concentrating process at an estimated timing of a start. Thereby, it is possible to decrease a waiting time after a concentrating process is ended and before a liquid sending process is started as much as possible, so that it is possible to prevent or reduce a decrease of a concentration of phosphoric acid in a mixed liquid M within such a waiting time.

As has been described above, a storage device (a mixing device 10 as an example thereof) according to an embodiment includes a storage tank (a tank 14 as an example thereof), a heating mechanism (a heater 17 as an example thereof), and a controller. The storage tank stores a processing liquid (a mixed liquid M as an example thereof) that contains an aqueous solution of phosphoric acid and an additive (a deposition preventing/reducing agent as an example thereof). The heating mechanism heats the processing liquid that is stored in the storage tank. The controller controls the heating mechanism to execute a concentration maintaining process where a temperature of the processing liquid is adjusted in such a manner that an amount of evaporation of water for the processing liquid in the storage tank approaches an amount of absorption of moisture for the processing liquid in the storage tank. A temperature of a processing liquid is adjusted in such a manner that an amount of evaporation of water for the processing liquid approaches an amount of absorption of moisture for a mixed liquid M, so that it is possible to prevent or reduce a change of a concentration of the processing liquid in a storage tank. Thereby, it is possible to implement substrate processing suitably.

The storage device according to an embodiment may include a processing liquid supply unit (a phosphoric acid aqueous solution supply unit 11 and a deposition preventing/reducing agent supply unit 12 as examples thereof) that supplies the processing liquid to the storage tank. Furthermore, the controller controls the processing liquid supply unit to execute a storing process (a mixing process as an example thereof) where the processing liquid is stored in the storage tank and controls the heating mechanism to execute a concentrating process where the processing liquid that is stored in the storage tank is concentrated by heating thereof, before the concentration maintaining process. In such a case, in the concentration maintaining process, the controller controls the heating mechanism to heat the processing liquid in such a manner that an amount of the processing liquid in the storage tank after the concentrating process is maintained, so that an amount of evaporation of water for the processing liquid in the storage tank approaches an amount of absorption of moisture for the processing liquid in the storage tank. Thereby, it is possible to facilitate maintenance of a concentration of phosphoric acid in a processing liquid.

The storage device according to an embodiment may include a liquid level detecting unit (a first liquid level sensor S1 or a third liquid level sensor as an example thereof) that detects a liquid level of the processing liquid that is stored in the storage tank. In such a case, the controller may control the heating mechanism based on a signal from the liquid level detecting unit in the concentration maintaining process. Thereby, it is possible to facilitate maintenance of a concentration of phosphoric acid in a processing liquid.

The controller may execute the concentration maintaining process within at least a part of a period of time after the concentrating process and before a liquid sending process is started where the processing liquid that is stored in the storage tank is sent to a processing tank (a processing tank 31 as an example thereof) where a process for a substrate is executed. Thereby, it is possible to maintain a processing liquid with a desired concentration and supply it from a storage tank to a processing tank.

The storage device according to an embodiment may include a gas supply unit (a gas supply unit 27 as an example thereof) that supplies a gas to a space (a housing unit 26 as an example thereof) that houses the storage tank, and a gas discharge unit (a gas discharge unit 28 as an example thereof) that discharges a gas from the space. In such a case, the controller may operate the gas supply unit at a first amount of supply of a gas and operate the gas discharge unit at a first amount of discharge of a gas, during execution of the concentrating process, and operate the gas supply unit at a second amount of supply of a gas that is less than the first amount of supply of a gas and operate the gas discharge unit at a second amount of discharge of a gas that is less than the first amount of discharge of a gas, during execution of the concentration maintaining process. An amount of supply of a gas and an amount of discharge of a gas are decreased at a time of a concentration maintaining process, so that it is possible to prevent or reduce an amount of absorption of moisture for a processing liquid. That is, it is possible to prevent or reduce a variation of a concentration for a processing liquid.

The gas supply unit may supply a dry gas ($N_2$ gas or dry air as an example thereof) to the space. A dry gas is supplied, so that it is possible to prevent or reduce absorption of moisture for a processing liquid.

The gas discharge unit may include a discharged gas cooling unit (a discharged gas cooling unit 28c as an example thereof) that cools a gas that is discharged from the space. A discharged gas cooling mechanism is included, so that, for example, it is possible to prevent or reduce generating of dew condensation in factory equipment that is connected to a gas discharge unit.

The processing liquid supply unit may include a phosphoric acid aqueous solution supply unit (a phosphoric acid aqueous solution supply unit 11 as an example thereof) that supplies the aqueous solution of phosphoric acid to the storage tank, and an additive supply unit (a deposition preventing/reducing agent supply unit 12 as an example thereof) that supplies the additive to the storage tank.

The storage device according to an embodiment may include a circulation route (a circulation route 15 as an example thereof) that discharges the processing liquid that is stored in the storage tank from the storage tank and returns it to the storage tank. In such a case, the hating mechanism may be provided on the circulation route.

According to an embodiment, it is possible to implement substrate processing properly by a processing liquid that includes an aqueous solution of phosphoric acid and a silicon solution.

Although an embodiment(s) of the present disclosure has/have been explained above, the present disclosure is not limited to an embodiment(s) as described above and a variety of modifications are possible without departing from an essence thereof.

It should be considered that an embodiment(s) as disclosed herein is/are not limitative but is/are illustrative in all aspects thereof. In fact, it is possible to implement an embodiment(s) as described above in a variety of forms. Furthermore, an embodiment(s) as described above may be omitted, substituted, or modified in a variety of forms without departing from the appended claim(s) and an essence thereof.

What is claimed is:

1. A storage device, comprising:
   a storage tank that stores a processing liquid that contains an aqueous solution of phosphoric acid and an additive;
   a heater that heats the processing liquid that is stored in the storage tank;
   a circulation route that discharges the processing liquid that is stored in the storage tank from the storage tank and returns the processing liquid to the storage tank, the heater being provided on the circulation route;
   a liquid sending route that branches from the circulation route and sends the processing liquid to a processing tank where a process for a substrate is executed;
   a controller that is configured to control the heater to execute a concentration maintaining process where a temperature of the processing liquid is adjusted to control an amount of evaporation of water for the processing liquid in the storage tank to be a same as an amount of absorption of moisture for the processing liquid in the storage tank, and
   a processing liquid supply that supplies the processing liquid to the storage tank, wherein
   the controller is further configured to control the processing liquid supply to execute a storing process where the processing liquid is stored in the storage tank and control the heater to execute a concentrating process where the processing liquid that is stored in the storage tank is concentrated by heating thereof, before the concentration maintaining process,
   in the concentration maintaining process, the heater is controlled to heat the processing liquid in such a manner that an amount of the processing liquid in the storage tank after the concentrating process is maintained, so that the amount of evaporation of water for the processing liquid in the storage tank is a same as the amount of absorption of moisture for the processing liquid in the storage tank,
   the controller is further configured to
      execute the concentration maintaining process within at least a part of a period of time after the concentrating process and before a liquid sending process is started where the processing liquid that is stored in the storage tank is sent to the processing tank,
      execute the concentrating process in such a manner that a heating temperature of the processing liquid is preliminarily determined as a temperature where the amount of evaporation of water for the processing liquid exceeds the amount of absorption of moisture for the processing liquid, and
      execute the concentration maintaining process in such a manner that the processing liquid is heated at a temperature that is higher than an ordinary temperature and is lower than the heating temperature.

2. The storage device according to claim 1, further comprising a liquid level detector that detects a liquid level of the processing liquid that is stored in the storage tank, wherein the controller is configured to control the heater based on a signal from the liquid level detector in the concentration maintaining process.

3. The storage device according to claim 1, further comprising:

a gas supply that supplies a gas to a space that houses the storage tank; and a gas discharge that discharges a gas from the space, wherein the controller is configured to operate the gas supply at a first amount of supply of a gas and operate the gas discharge at a first amount of discharge of a gas, during execution of the concentrating process, and operate the gas supply at a second amount of supply of a gas that is less than the first amount of supply of a gas and operate the gas discharge at a second amount of discharge of a gas that is less than the first amount of discharge of a gas, during execution of the concentration maintaining process.

4. The storage device according to claim 3, wherein the gas supply supplies a dry gas to the space.

5. The storage device according to claim 3, wherein the gas discharge includes a discharged gas cooler that cools a gas that is discharged from the space.

6. The storage device according to claim 1, wherein the processing liquid supply includes:

a phosphoric acid aqueous solution supplier that supplies the aqueous solution of phosphoric acid to the storage tank; and an additive supplier that supplies the additive to the storage tank.

7. The storage device according to claim 2, further comprising:

a gas supply that supplies a gas to a space that houses the storage tank; and a gas discharge that discharges a gas from the space, wherein the controller is configured to operate the gas supply at a first amount of supply of a gas and operate the gas discharge at a first amount of discharge of a gas, during execution of the concentrating process, and operate the gas supply at a second amount of supply of a gas that is less than the first amount of supply of a gas and operate the gas discharge at a second amount of discharge of a gas that is less than the first amount of discharge of a gas, during execution of the concentration maintaining process.

8. The storage device according to claim 2, wherein the processing liquid supply includes:

a phosphoric acid aqueous solution supplier that supplies the aqueous solution of phosphoric acid to the storage tank; and an additive supplier that supplies the additive to the storage tank.

9. The storage device according to claim 1, wherein the temperature that is higher than the ordinary temperature and is lower than the heating temperature is lower than 100° C.

* * * * *